United States Patent
Sabatino

(10) Patent No.: US 6,923,057 B2
(45) Date of Patent: Aug. 2, 2005

(54) LIQUID LEVEL SENDING UNIT WITH FLEXIBLE SENSOR BOARD

(76) Inventor: Daniel Sabatino, 3 Carraige Dr., Burlington, CT (US) 06013

( * ) Notice: Subject to any disclaimer, the term of this patent is extended or adjusted under 35 U.S.C. 154(b) by 0 days.

(21) Appl. No.: 10/791,286

(22) Filed: Mar. 3, 2004

(65) Prior Publication Data

US 2004/0221647 A1 Nov. 11, 2004

Related U.S. Application Data

(60) Provisional application No. 60/450,596, filed on Mar. 3, 2003.

(51) Int. Cl.[7] .................. G01F 23/36; G01F 23/52; G01F 23/60
(52) U.S. Cl. .................. 73/313; 73/290 R; 73/290 V
(58) Field of Search .................. 73/313, 290 R, 73/290 V

(56) References Cited

U.S. PATENT DOCUMENTS

| | | |
|---|---|---|
| 3,377,537 A | 4/1968 | Brailsford |
| 3,473,381 A | 10/1969 | Allen, Jr. |
| 3,976,963 A | 8/1976 | Kubler |
| 4,199,983 A | 4/1980 | Kobayashi et al. |
| 4,229,798 A | 10/1980 | Rosie et al. |
| 4,384,184 A | 5/1983 | Alvarez |
| 4,589,282 A | 5/1986 | Dumery |
| 4,627,283 A | 12/1986 | Nishida et al. |
| 4,637,254 A | 1/1987 | Dyben et al. |
| 4,908,783 A | 3/1990 | Maier |
| 4,976,146 A | 12/1990 | Senghaas et al. |
| 5,124,686 A | 6/1992 | White et al. |
| 5,196,828 A * | 3/1993 | Keniston .................. 340/568.7 |
| 5,224,379 A | 7/1993 | Koebernik et al. |
| 5,231,508 A | 7/1993 | Murphy, Jr. |
| 5,369,396 A | 11/1994 | Kurata et al. |
| 5,485,143 A * | 1/1996 | Keniston .................. 340/568.7 |
| 5,532,673 A | 7/1996 | Olson et al. |
| 5,627,523 A | 5/1997 | Besprozvanny et al. |
| 5,644,230 A * | 7/1997 | Pant et al. .................. 324/247 |
| 6,254,432 B1 | 7/2001 | Yoshigi |
| 6,363,785 B1 * | 4/2002 | Senghaas et al. .............. 73/313 |
| 6,380,499 B1 | 4/2002 | Edwards |
| 6,408,692 B1 | 6/2002 | Glahn |
| 6,415,209 B1 | 7/2002 | Reimer |
| 6,481,278 B1 | 11/2002 | Kaylor et al. |
| 6,571,626 B1 | 6/2003 | Herford |
| 6,579,728 B2 * | 6/2003 | Grant et al. .................. 438/3 |
| 6,588,288 B1 | 7/2003 | Swindler |

OTHER PUBLICATIONS

Tankwatch 4 Level Monitor System, Owner's Manual: Installation Instructions, p. 4, Dometic Corporation SeaLand.

* cited by examiner

*Primary Examiner*—Hezron Williams
*Assistant Examiner*—Rodney Frank
(74) *Attorney, Agent, or Firm*—Connolly Bove Lodge & Hutz LLP; Myron K. Wyche

(57) ABSTRACT

A flexible liquid level sensor board assembly for application with liquid level sending units is presented. The liquid level sending unit includes a stem, float, and a flexible sensor board assembly. The flexible sensor board assembly is a distinct component of the sending unit and as such is capable of repeated insertion and removal from the stem. The flexible sensor board assembly is therefore ideal for existing/retrofit applications and new installations alike.

15 Claims, 7 Drawing Sheets

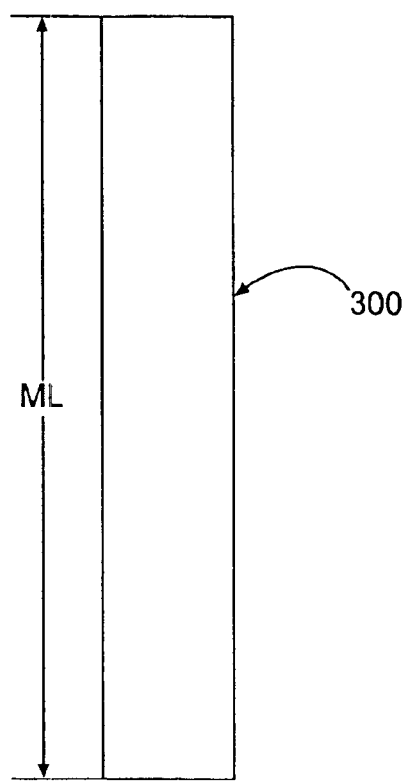
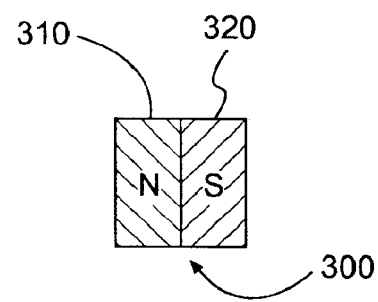
FIG. 3A     FIG. 3B

LIQUID LEVEL SENDING UNIT WITH FLEXIBLE SENSOR BOARD

This application claims benefit under 35 USC 119 (e) of U.S. Provisional Application No. 60/450,596, filed Mar. 03, 2003.

FIELD OF THE INVENTION

The present invention relates generally to liquid level indication and, more particularly, to sending units that convert liquid level to a level indicating measure.

BACKGROUND OF THE INVENTION

Indication of fluid or liquid level is a critical variable in process control, storage tank monitoring, and mechanical systems where liquids are contained. Level monitoring systems for liquids typically comprise a transducer to convert liquid level to an appropriate level indicating variable or signal, a transmission medium for conveying the variable or signal, a receiver to accept and process the variable or signal, and a display for visual indication. Liquid level indication is of particular importance in the marine industry. For example, when boats travel in the open sea, an accurate indication of fuel quantity is an essential component to successful navigation. Thus, confidence in fuel indication accuracy is critical. Yet it is often the case that boat manufactures will use the same traditional form of level sensing across their entire line of boats, regardless of the application the boat is to used for, or its cost. Thus, boats costing hundreds of thousands of dollars use the same level sensing technology as less expensive boats.

A common problem with traditional level sensing technology is premature failure of the sending unit. The sending unit is the apparatus which provides a measure of liquid level within a tank. In the marine industry, the sensing components are frequently cemented into a liquid-tight stem using an epoxy or potting compound. This practice is problematic, however, because vibration and movement of the boat are conveyed to the sending unit. Thus, over time, the sending unit fails and requires replacement. Such premature failures are particularly problematic when a boat is far from port.

To compound the problem of failing sending units, space on boats is often at a premium. Thus, fuel tanks are frequently located in cramped engine. Thus, when a sending unit fails, it is difficult to access. Further, because traditional sending units are rigid (in order to protect the sensitive sensors along their length), extraction requires either removal of the fuel storage tank or cutting a hole in the floor of the deck to access the sending unit from above and to remove the unit on a straight vertical. Further, because traditional sending units are not designed to be bent, they inherently lack flexibility and their installed components crack and fail whenever the unit is subjected to a bending force.

Accordingly, what is needed is a sending unit that is robust, so as to withstand the harsh applications of marine use, is simple to replace and repair, and can withstand bending at acute angles and still function.

SUMMARY OF THE INVENTION

Aspects of the present invention include a flexible sensor board assembly, comprising a plurality of magnetically sensitive sensor elements; a plurality of resistor elements; a flexible circuit board on which said sensor elements and said resistor elements are mounted and interconnected; and a seal covering said flexible circuit board, sensor elements, and resistor elements, wherein said sensor elements and said resistor elements are located on said flexible circuit board to enable bending of said flexible circuit board, said bending having a radius that is a function of the material properties of said flexible circuit board, and the separation distance between adjacent sensor and resistor elements.

Another aspect of the present invention includes A liquid level sending unit, comprising a liquid impervious elongate stem having proximal and distal ends, said elongate stem forming an aperture at said proximal end and sealed at said distal end; a flange coupled to said proximal end of said elongate stem; a stop ring coupled to said distal end of said elongate stem; a float slideably coupled to said elongate stem for sliding up and down and rotating about said stem between said flange and said stop ring, said float having one or more embedded magnets for magnetic communication with a flexible sensor board assembly, said assembly comprising a plurality of magnetically sensitive sensor elements; a plurality of resistor elements; a flexible circuit board on which said sensor elements and said resistor elements are mounted and interconnected; a seal covering said flexible circuit board, sensor elements, and resistor elements; and a fitting for removably attaching to said elongate stem, wherein said sensor elements and said resistor elements are located on said flexible circuit board to enable bending of said flexible circuit board, said bending having a radius that is a function of the material properties of said flexible circuit board, and the separation distance between adjacent sensor and resistor elements.

Another aspect of the present invention includes a method of installing a flexible sensor board assembly, the method comprising inserting a portion of said flexible sensor board assembly into a sending unit stem; bending said flexible sensor board assembly at least one time during installation; inserting a remainder of said flexible sensor board assembly; and sealing said flexible sensor board assembly to said sending unit stem.

BRIEF DESCRIPTION OF THE DRAWINGS

FIG. 3A illustrates an elevation view of a magnet in accordance with an embodiment of the present invention.

FIG. 3B illustrates a plan view of the magnet illustrated in FIG. 3B.

DETAILED DESCRIPTION

Disclosed is a liquid level sending unit comprising a stem, float, and flexible sensor board assembly. The flexible sensor board assembly is a distinct component of the sending unit and as such is capable of repeated insertion and removal from the stem. Thus, the disclosed flexible sensor board assembly is ideal for existing/retrofit applications and new installations alike.

Figure 1A:
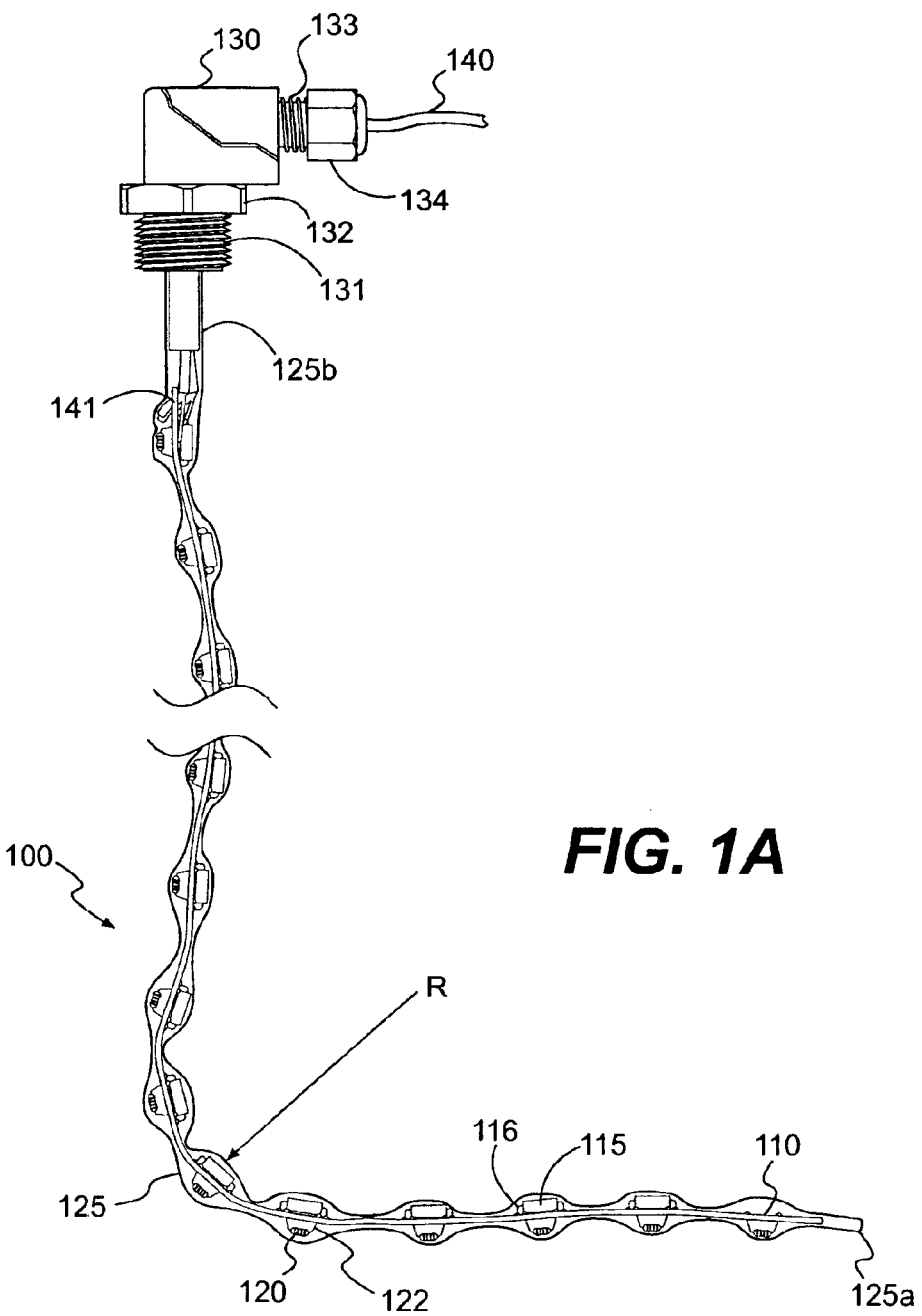
FIG. 1A illustrates a flexible sensor board assembly according to an embodiment of the present invention.

FIG. 1A illustrates a flexible sensor board assembly 100 in accordance with an embodiment of the present invention. The flexible sensor board assembly 100 comprises flexible circuit board 110, plurality of sensor elements 115, plurality of resistor elements 120, seal 125, fitting 130, and wires 140. Flexible circuit board 110 comprises an elongate length of material suitable to hold electrical circuitry and components. The circuitry may be formed of wires interconnecting the components, or it may be formed of solder traces. Components can be mounted to the flexible circuit board using any convenient method, such as through-hole, surface mount, and tape automated bonding (TAB). Thru-hole connections feature insertion of component pins into a mating through-hole fabricated in board 110; surface mount connections feature connection of component leads directly to the board 110 surface; and TAB connections also feature bonding of component leads directly to the board 110. These and other component mounting methodologies would be readily ascertainable by one of ordinary skill in the art.

Flexible circuit board 110 can be formed of a soft, pliable material, such as a Mylar membrane, or formed of a semi-rigid, flexible substrate, such as a fiber glass filled nylon substrate or any suitable dielectric material that permits the board to flex. Material selection for flexible circuit board 110 is based, in part, on the bend radius R that the flexible sensor board assembly 100 is required to undergo for a given installation. The smaller the bend radius R required, the more flexible the flexible circuit board material may be. Width and length of flexible circuit board 110 is not limited by the present invention, but, rather, should be suitable for the requirements of a given application, as well as size of the individual components forming the level sensing circuit.

Resistors 120 provide the function of impeding current flow by a measured amount, which is determined by the ohmic value of resistor 120, and may be of any variety known to the art, such as axial-lead carbon-composition, film-based, surface mount or semiconductor-based.

Sensors 115 are magnetically sensitive components that effect current flow in the circuit by changing state from an open position to a closed position or, alternatively, from a closed position to an open position when exposed to a magnetic field. Sensors in the open position block current flow and sensors in the closed position permit current flow. Sensors that change state from an initially open position to a closed position are known as "normally-open," and sensors that change state from an initially closed position to an open position are known as "normally-closed." Either normally-open or normally-closed sensors are suitable for use in the present invention. Sensors return to their normal or natural state when the magnetic field is removed.

Appropriate sensors 115 for use in the flexible sensor board assembly 100 include reed switches and hall effect switches. It is preferable that the sensors be encased in a shell to provide protection. In one embodiment of the invention, glass reed switches are over-molder with ABS plastic. By encasing each sensor 115 within a protective shell, each sensor is better able to withstand the movement that arises when the flexible circuit board 110 is bent, thus contributing to the robustness and durability of the design. When mounted to the flexible circuit board 110, leads 116 of the individual sensors 115 can remain unclipped to facilitate magnetic field coupling.

When mounted, sensors 115 may be oriented either vertically or horizontally relative to the flexible circuit board 110. Alternatively, a combination of vertical and horizontally mounted sensors 115 can be employed. Sensors 115 are typically narrower in width than length. Thus, when sensors 115 are mounted vertically, a flexible circuit board 110 with a narrower profile can be used. When sensors 115 are mounted horizontally, a wider flexible circuit board 110 can be used and more sensors 115 per unit length of flexible circuit board 110 can be installed, increasing thereby the level sensing resolution of the board.

Interconnection of the sensors 115 and resistors 120 is achieved with a circuit design dictated by the type of sensor employed and is well within the ordinary skill of one in the art to appropriately effectuate level measurement. In one embodiment of the invention, the electrical circuit is oriented vertically along the flexible circuit board 110 and consists of a plurality of series connected resistors along one leg of the circuit, and a common along the other leg. The final resistor in the series is connected to the common at the bottom of the run. Sensors 115 are then connected between two adjacent resistors of the series resistor string and the common to form a ladder-type circuit structure. Such a circuit design sequentially incorporates or removes resistors 120 as individual sensors 115 are triggered up and down the network.

Wire 140 consists of a pair of conductors and may be of any size suitable for instrumentation wiring and is electrically connected to flexible circuit board 110 at 141. Wire 140 should be of a size and type appropriate under the relevant code governing the installation, if applicable. For example, wire 140 can be selected to comply with the U.S. National Electric Code for certain installations within the United States. Wire 140 may be twisted pair conductors or straight. Twisted pair construction is particularly apt to reduce magnetic pick-up in environments possessing electromagnetic noise. In some installations, a ground connection may be provided so that only a single wire 140 will be required.

Seal 125 provides a protective barrier against dust and moisture, and aids in the mechanical support of the flexible sensor board assembly 100. Seal 125 aids in mechanical support by helping to distribute the force imparted by bending over a wider area of the flexible circuit board 110. Thus, seal 125 helps inhibit flexible circuit board 110 kinking when stress is applied through bending, which could lead to cracking and failure of the board. Seal 125 also helps lock down components to the flexible circuit board 110. Seal 125 also helps to increase the overall elasticity of the flexible sensor board assembly 100, and helps to improve the general robustness of the unit. Seal 125 can also provide a dielectric barrier to prevent electrical conduction between the circuit assembly on flexible circuit board 110 and external metal surfaces.

As illustrated in FIG. 1A, seal 125 is fitted over wire 140 at end 125b in a dust and moisture resistance fashion. Seal 125 is closed at end 125a. Closure of seal 125 at end 125a can be accomplished through a physical seal of the end, or plugging with a gel or suitable adhesive. Seal 125 can be formed of heat sensitive material, such as shrink tubing, or any suitable dielectric material formed over the sensor board. Alternatively, seal 125 can be formed by dipping the assembled flexible circuit board 110 into a liquid rubber type compound and then set aside to harden. Seal 125 contributes to the overall robustness and durability of flexible sensor board assembly 100.

Fitting 130 is shown in FIG. 1A as an "elbow" or "L" fitting providing a 90-degree connection to the flexible circuit board. Alternatively, fitting 130 can be "straight" or "angled." Fitting 130 can be metal or plastic, and slides over wire 140 and seal 125 at end 125*b*. Fitting 130 is threaded at ends 131 and 133, with respective lock nuts 132 and 134 to facilitate watertight connection.

Figure 1B:
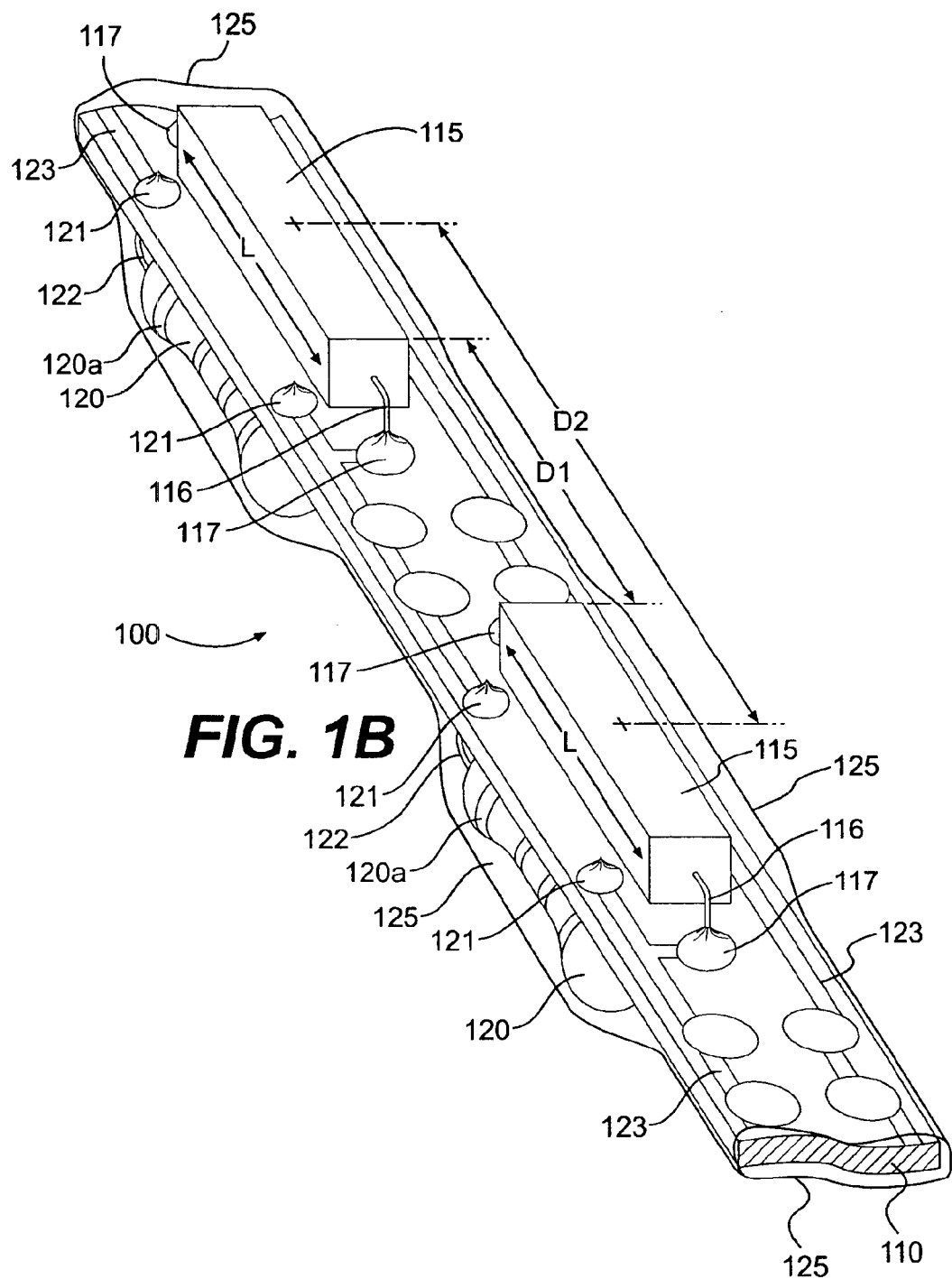
FIG. 1B is a perspective view of a segment of the flexible sensor board assembly illustrated in FIG. 1A.

FIG. 1B is a perspective view of a segment of the flexible sensor board assembly 100 in accordance with an embodiment of the present invention. In the embodiment shown, resistors 120 are illustrated as the axial-lead carbon-composition variety with leads 122 electrically connected to flexible circuit board 110 via solder connection 121. As discussed previously, however, alternative embodiments of the invention could utilize other resistor types, such as film-based, surface mount or semiconductor-based. Bands 120*a* serve to identify the resistance value of each individual resistor 120. The plurality of resistors 115 within flexible sensor board assembly 100 may be comprised of one or more discrete resistance values. Resistance value is measured in Ohms.

Sensors 115 with leads 116 are shown electrically connected to flexible circuit board 110 via solder connection 117. Leads 116 of the individual sensors 115 can remain unclipped to facilitate coupling to available magnetic fields. Sensors 115 and resistors 120 are mounted on flexible circuit board 110 via through-holes and electrically connected via trace or foil 123 coupled to the flexible circuit board 110. Seal 125 covers flexible circuit board 110 and installed sensors 115 and resistors 120.

The separation distance between adjacent sensors 115 is provided by end-to-end distance D1, center-to-center distance D2, and length L of the individual sensors 115. End-to-end distance D1 is the distance between ends of adjacent sensors 115, and center-to-center distance D2 is the distance between center points of adjacent sensors 115. End-to-end distance D1 is a factor in determining the magnitude of bend radius R of the flexible sensor board assembly 100, illustrated in FIG. 1A. The shorter the end-to-end distance D1 is, the stiffer the flexible sensor board assembly 100 will be, and, consequently, the smaller the available bend; i.e., the larger the radius R is. Conversely, the larger the end-to-end distance D1 is, the more flexible the flexible sensor board assembly 100 will be, and, consequently, the larger the available bend; i.e., the smaller the radius R is. Thus, the ability of the flexible sensor board assembly 100 to bend is both a function of end-to-end distance D1 and material composition of flexible circuit board 110. Resistors 120 are mounted in relation to sensors 115 in a manner to optimize flexibility of flexible circuit board 110. In one embodiment of the present invention, resistors 120 are mounted below sensors 115 on the opposite side of flexible circuit board 110.

In some applications, the flexible sensor board assembly 100 can bend at a radius of less than 5 feet. In other applications the flexible sensor board assembly 100 can bend at a radius of less than 3 feet. In yet additional applications the flexible sensor board assembly 100 can bend at a radii of 2 feet, 1 foot, 6 inches, 4 inches, 3 inches, 2 inches, and 1 inch.

Center-to-center distance D2 and length L are factors in establishing end-to-end distance D1. The smaller the length L is, i.e., the smaller the sensor 115 is, the shorter the center-to-center distance D2 can be for a given end-to-end distance D1, i.e., for a given available bend radius R.

Center-to-center distance D2 is a factor in resolution sensitivity of the flexible sensor board assembly 100. The smaller the center-to-center distance D2 can be, the finer the gradation in liquid level measurement that can be achieved. For example, in shallow liquid containers a low D2 is desirable because small changes in liquid level represent a proportionally greater change in tank capacity than would the same change represent in a deeper liquid container, other dimensions being equal. Conversely, for deep liquid containers a larger distance D2 can be tolerable for a given acceptable level of resolution. By way of example, and not limiting upon the present invention's scope, alternate embodiments provide center-to-center distance D2 of 1-inch-on-center, ¾-inch-on-center, ½-inch-on-center, and ¼-inch-on-center—in fact, D2 can be configured to any desired distance practicable. Thus, the present invention affords design flexibility in terms of quantity and placement of sensors 115 so as to optimize sending unit performance in accordance with the needs of a particular installation.

Figure 2A:
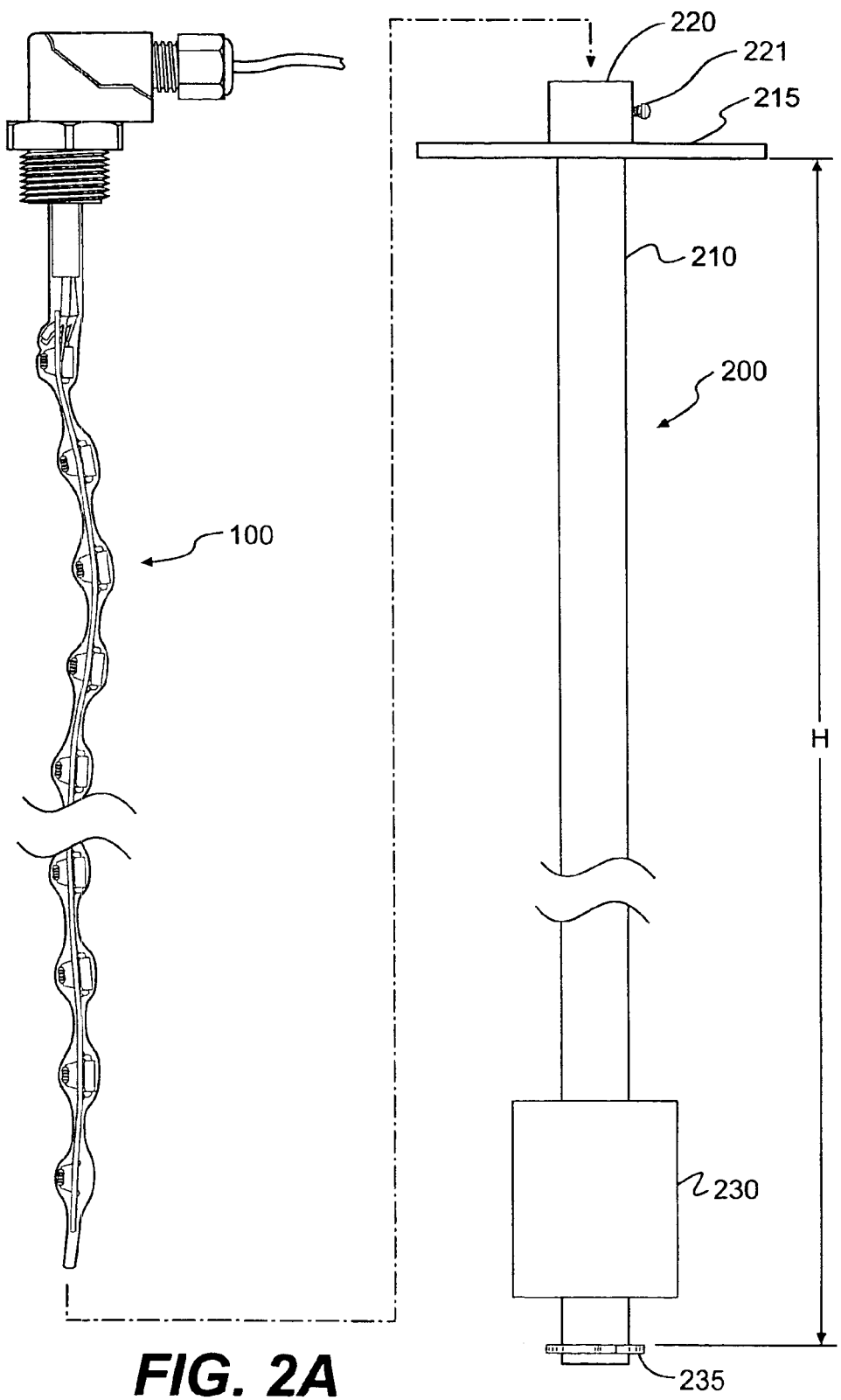
FIG. 2A illustrates the direction of insertion of the flexible sensor board assembly into a stem and float assembly.
Figure 2B:
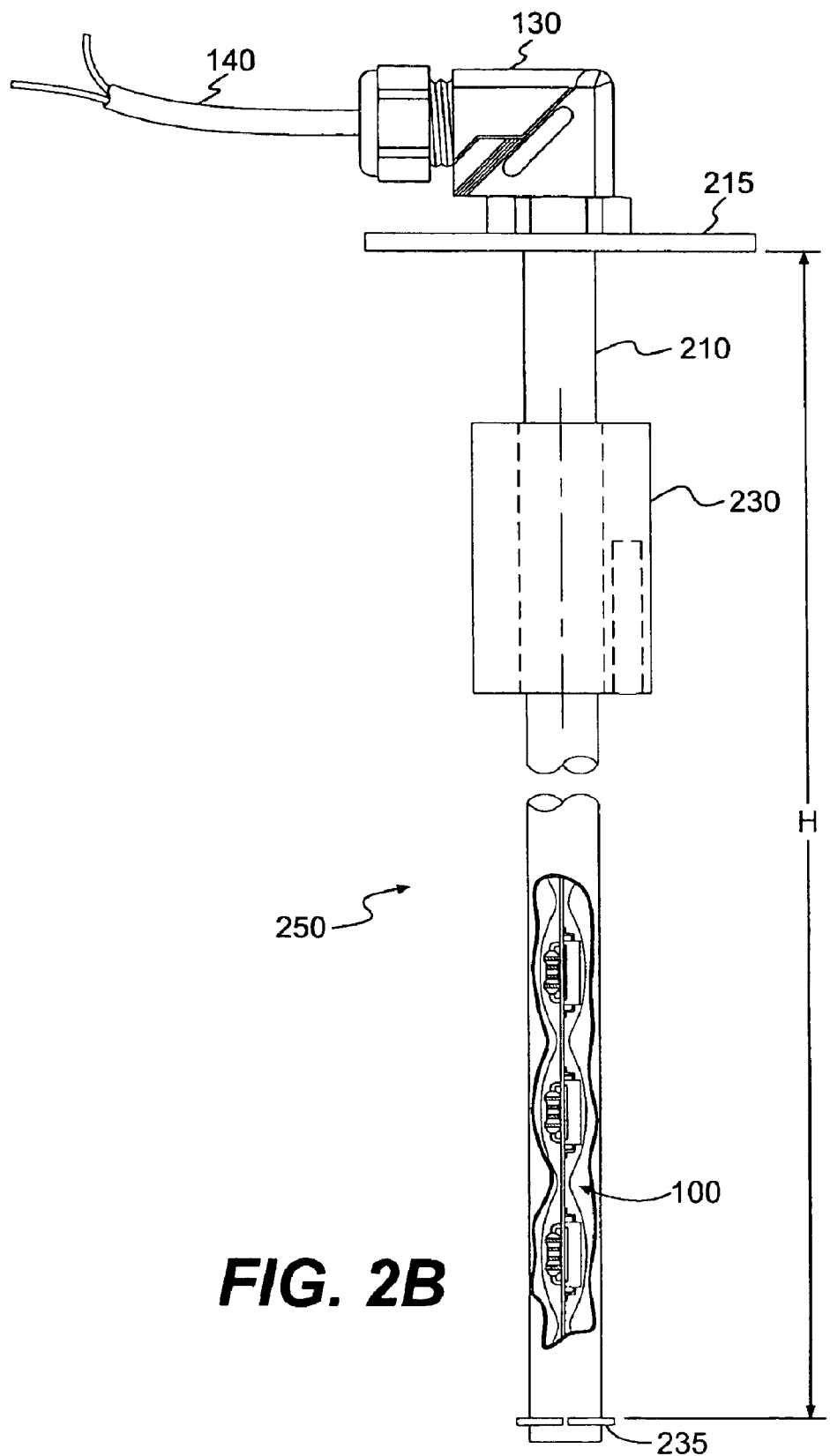
FIG. 2B illustrates the completed insertion of flexible sensor board assembly into a stem and float assembly to form a sending unit.

FIG. 2A illustrates the direction of insertion of flexible sensor board assembly 100 into stem and float assembly 200. Extraction, or removal of the flexible sensor board assembly 100 would be in reverse. FIG. 2B illustrates the completed insertion of flexible sensor board assembly 100 into stem 210 to form sending unit 250. Stem and float assembly 200 is comprised of stem 210, flange 215, threaded cap 220, ground terminal 221, stop ring 235, and float 230. Float 230 can be formed of any lightweight material suitable for use in the liquid that sending unit 250 is to measure. For example, float 230 may be formed of a lightweight, closed-cell material such as nitrophyl. Within float 230 are one or more magnets, which add weight, so float 230 must be sized to maintain adequate buoyancy. Float 230 is shaped so as to fit around stem 210 in a manner that float 230 may slide up and down stem 210, as well as freely rotate both clockwise and counter-clockwise about stem 210. In one embodiment, float 230 has a cross-section that is annular. Float 230 is free to travel up and down stem 210, but is prevented from traveling beyond the stem at the top by flange 215, and at the bottom by stop ring 235.

Stem 210 forms a liquid-tight cavity to receive flexible sensor board assembly 100. Stem 210 can be formed of any material that is impervious to the liquid that sending unit 250 is to measure, and that permits sensors 115 to receive and trigger on the magnetic field emanating from the magnets embedded within float 230. For example, stem 210 may be formed of non-ferrous stainless steel. Stem 210 is positioned vertically within the liquid storage tank or vessel to be measured, and has a length H that extends the full depth of the storage tank or vessel.

Stem 210 is coupled to flange 215, which in turn couples to the liquid storage tank or vessel in a manner acceptable to those of ordinary skill in the art. In one embodiment of the present invention, stem 210 is welded to flange 215.

Flange 215 couples to threaded cap 220, which is sized to receive fitting 130. Preferably, fitting 130 forms a watertight seal with stem 210 and flange 215 when fully engaged with threaded cap 220. Ground terminal 221 is provided to enable connection of a grounding wire so that sending unit 250, when formed of metal, can be grounded at the same potential as the equipment with which it operates.

FIGS. 3A and 3B illustrate magnet 300, which is representative of the style of magnet to be embedded within float 230. Unlike traditional magnets, which are polarized end-to-end, magnet 300 is polarized face-to-face, as illustrated in FIG. 3B. North polarization 310 is on one face of magnet 300, while South polarization 320 is on the opposite face of magnet 300.

Float 230 may contain one or more magnets 300 embedded within to activate adjacent magnetic sensors 115 as float 230 travels up and down, or rotates around, stem 210. The quantity of magnets 300 will be determined by the desired magnetic field strength necessary to activate the plurality of magnetically sensitive sensors 115, and the strength of the magnetic field available from each magnet 300. Thus, the stronger the magnetic field available from each individual magnet 300, the fewer that will be necessary to activate sensors 115. Preferably, a sufficiently strong magnetic field to activate sensors 115 is provided regardless of the position of float 230

Figure 4A:
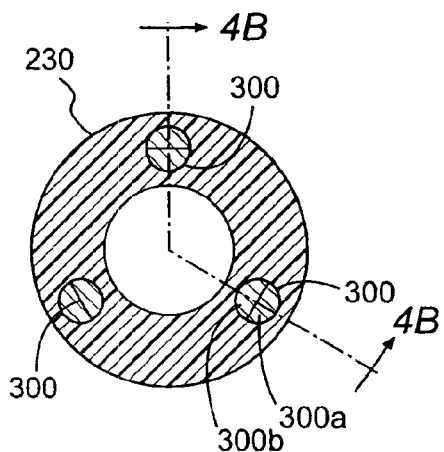
FIG. 4A illustrates a vertical cross-sectional view of a sending unit float with magnets embedded in accordance with an embodiment of the present invention.
Figure 4B:
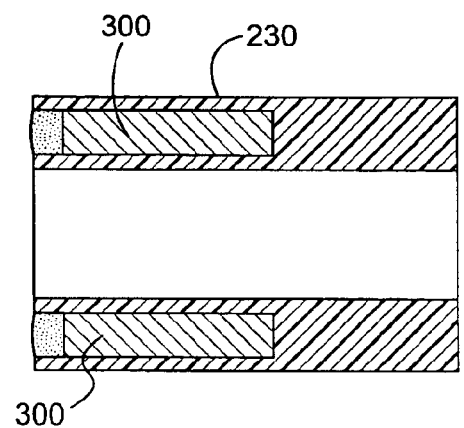
FIG. 4B illustrates a horizontal cross-sectional view of a sending unit float with magnets embedded in accordance with an embodiment of the present invention.
Figure 5A:
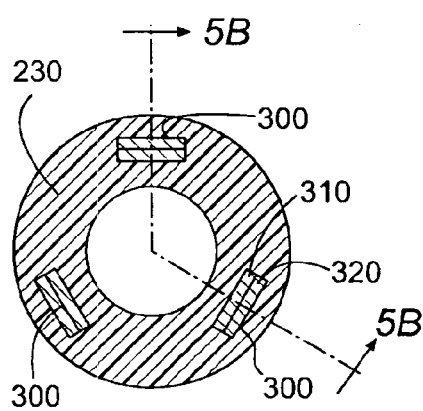
FIG. 5A illustrates a vertical cross-sectional view of a sending unit float with magnets embedded in accordance with an embodiment of the present invention.
Figure 5B:
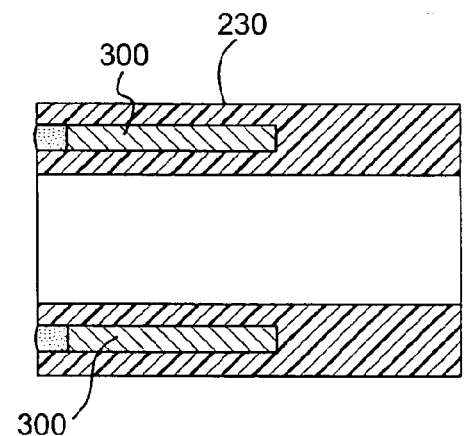
FIG. 5B illustrates a horizontal cross-sectional view of a sending unit float with magnets embedded in accordance with an embodiment of the present invention.

When multiple magnets are embedded within float 230, each magnet 300 within float 230 should be uniformly oriented such that all magnets have either their North Pole 310 facing outward or their South Pole 320 facing outward. If the Pole orientation were mixed, i.e., a magnet with a South Pole 320 facing outward is placed adjacent to a magnet with a North Pole 310 facing outward, then the magnetic field between the two magnets could cancel to zero. Such a field cancellation could interfere with the desired operation of the magnetic sensors 115 because float 230 may then fail to trigger sensors 115, or a sensor 115 may falsely return to its normal state following activation. FIGS. 4A and 4B, and FIGS. 5A and 5B illustrate magnet 300 positioning within vertical and horizontal cross-sections of float 230. Although FIGS. 4A–5B illustrate three magnets 300, each with their North Pole 310 oriented outward, magnets 300 could also be located with their South Pole 320 facing outward, and the quantity of magnets 300 could vary as described above. Also, although FIGS. 4A and 4B show magnets 300 as having a circular cross-section, and FIGS. 5A and 5B show magnets 300 as having a rectangular cross-section, any cross-sectional shape would suffice provided the magnetic field strength were adequate.

Referring to FIG. 3A, magnet 300 is sized so that its magnetic length ML is capable of concurrently activating two adjacent sensors 115 as float 230 travels between positions along stem 210. In operation of the flexible sensor board assembly 100, when sensors 115 are configured in a "normally-open" manner, the magnetic field emanating from float 230 will trigger a sensor 115 to close when the float is in proximity to the sensor. As float 230 travels away from the activated sensor 115, the magnetic field strength at the position of sensor 115 will diminish and the sensor 115 will toggle to its "normally-open" state. When float 230 is within the range of sensitivity for the next adjacent sensor 115, that sensor will toggle and lock in the circuit. So that the output of the flexible sensor board assembly 100 does not fluctuate as sensors toggle in and out of activation, it is desirable that one sensor latch before the previous is released. Thus, for a brief moment, two sensors 115 will be toggled at the same time. This condition is referred to as a "make-before-break" contact progression. Magnetic length ML is sized, and distance D2 is configured, such that an adjacent sensor 115 will toggle, before a previously activated sensor 115 is released. Although FIG. 3A shows a single magnet 300 to achieve magnetic length ML, alternate embodiments could utilize a plurality of smaller magnets to create the same required magnetic field strength.

Figure 6:
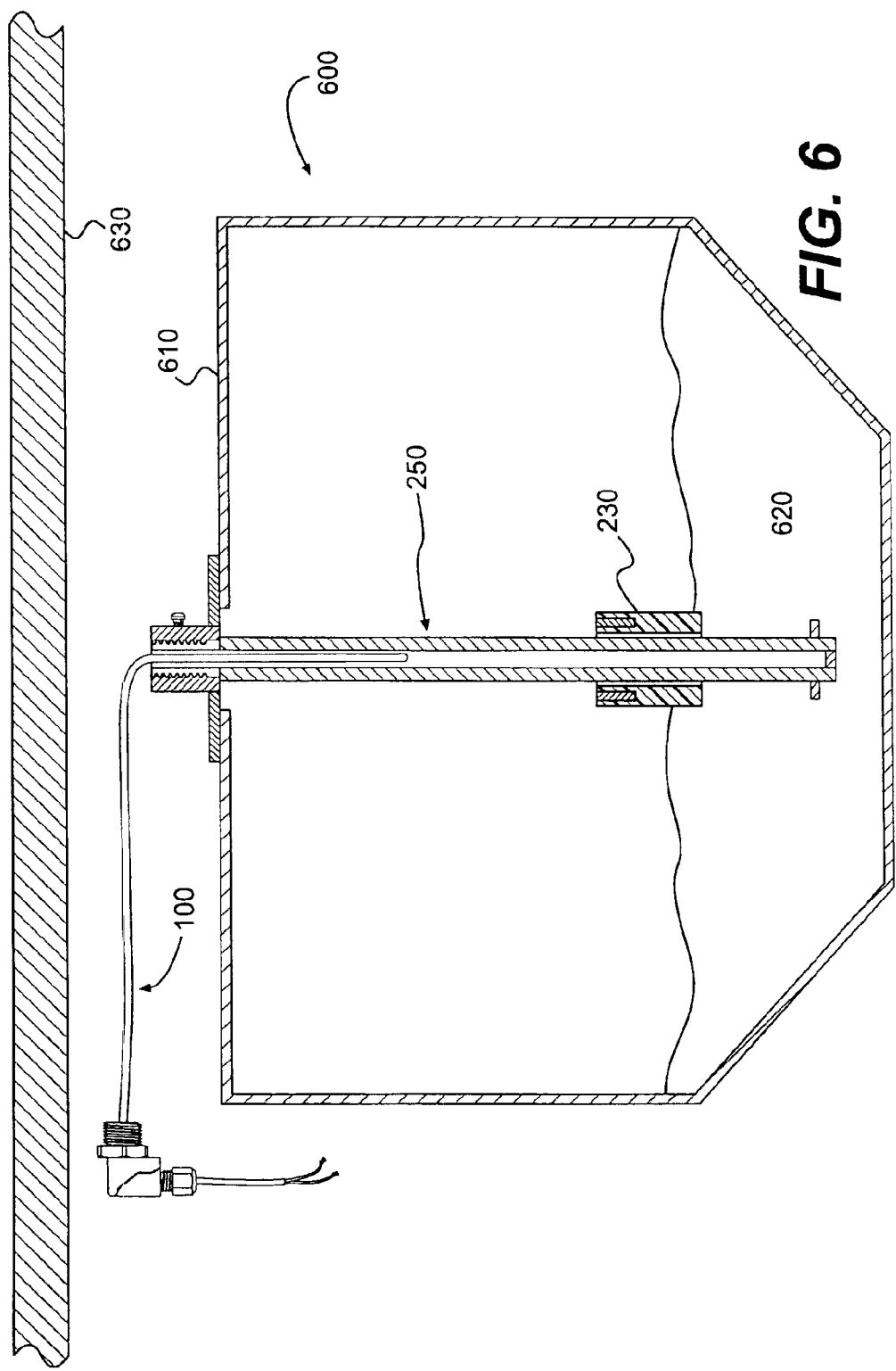
FIG. 6 illustrates insertion of the flexible sensor board assembly into a fuel storage tank.

FIG. 6 illustrates an example of the flexible sensor board assembly 100 installed within a boat fuel tank room 600. In construction of marine craft, space is often at a premium and as a result engine rooms tend to be crowded. Thus, fuel tanks quite often have very little space in which to be located. FIG. 6 illustrates this condition by showing fuel tank 610 positioned a short distance below deck 630. In many boating applications such distances are on the order of 4 to 6 inches. Fuel level sending unit 250 extends from the top of tank 610 to the bottom in order to provide accurate level indication of fuel 620. Because fuel level sending units occasionally require repair or replacement, the short distance between the top of fuel tank 610 and deck 630 presents a problem for traditional sending units, which must be extracted vertically. The necessity of vertical extraction of traditional sending units requires that either the fuel tank itself be removed or a hole be cut through the deck to gain access to the unit. In contrast, the flexible sensor board assembly 100 of the present invention may be bent to fit within the narrow space between tank 610 and deck 630, thus saving considerable effort and expense because the tank need not be removed or the deck need not be violated. Further, because the construction of flexible sensor board assembly 100 is inherently robust, servicing of sending unit 250 is seldom required.

More and more boating manufacturers are requiring fuel tank providers to certify the seal of a fuel tank following a pressure test before installation of the tank into boats. Because extraction of traditional sending units requires separation of the existing stem and float assembly from the fuel tank, the necessary breech of the tank to effect this removal voids the warranty of that tank. Because the disclosed flexible sensor board assembly can be removed and replaced without removal of the stem and float assembly, following installation and certification, the seal of the tank need not be violated and the tank may maintain certification and warranty.

As applied to the liquid level sending unit 250, when tank 610 is full of fuel 620, float 230 will be at its highest position, the upper most sensor is triggered and the first resistance value is connected across the voltage source. For embodiments of the invention where the first resistance value is smallest, output voltage of the supply can be configured to be its lowest, and level indication will be calibrated to indicate "Full." As the fuel level depletes and float 230 descends, sensors further down the sensor board will trigger, and prior sensors release, thus incorporating successive resistance values and increasing the overall resistance seen by the voltage source. Increase in resistance will cause the supply voltage to proportionally increase. When tank 610 is empty, the float will be at its bottom position resting on ring 235, and all resistors within the series string will be incorporated because the circuit is bridged to common at the base of the string. Thus, full resistance value is indicative of an empty tank, and level indication will be calibrated to indicate "Empty." In marine applications, the value of 30 ohms is often used to indicate a "Full" tank, whereas the value of 240 ohms is used to indicate an "Empty" tank. Because the geometric profile of a given tank or vessel is not necessarily linear, the values of the individual resistors forming the series string can be individually selected to accommodate nonlinear variances of the tank so that the fuel level indication provided is an accurate reflection of fuel volume within the tank or vessel.

Another applied example of the flexible sensor board assembly 100 is in the field of process control. Liquids within process systems often require a high level of purity and thus should not be exposed to contamination. Because the sensor boards of traditional sending units are seal inside the stem with epoxy or potting compound, the entire sending unit, sensor board and stem, must be removed to facilitate repair or replacement. Because sending units in accordance with the present invention feature a removable, flexible sensor board assembly 100, the sensor board unit of the assembly can be extracted from the process vessel without breeching the integrity of the liquid within. The ability to remove the flexible sensor board assembly 100 also facilitates tank cleaning in that the flexible sensor board assembly 100 can be removed before the tank is cleaned, which is often accomplished with high temperature steam.

In one embodiment of the invention, the flexible sensor board assembly 100 is a passive device and ideally suitable for installations in hazardous areas. Passive devices are characterized as having no active components; i.e., components that require their own supply power to operate, such as integrated circuits. For liquid level monitoring in hazardous area installations, such as diesel and gasoline fuel storage tanks, it is recommended that the flexible sensor board assembly 100 couple to an intrinsically safe supply. With respect to voltage, an intrinsically safe voltage supply is characterized as a voltage source having high internal resistance with low output current, which is held constant. So configured, the power output of the source is held low such that when the supply terminal is grounded, output voltage falls to ground potential and no spark occurs. Thus, at light or no load (i.e., short circuit) conditions, the intrinsically safe voltage supply provides its lowest level of voltage. As load increases, the supply voltage increases proportionally and at the limit (i.e., open circuit condition) the supply voltage is at its maximum design level.

Numerous characteristics and advantages have been set forth in the foregoing description, together with details of structure and function. The novel features are pointed out in the appended claims. This disclosure, however, is illustrative only and changes may be made in detail within the principle of the invention to the full extent indicated by the broad general meaning of the terms in which the appended claims are expressed. For example, impedance could be employed as the variable of measure instead of resistance. Such a design could utilize a radio frequency (RF) signal with a capacitor and switch configuration; the RF signal would be responsive to a change in impedance as the float moved up and down, and this responsiveness would be available to a system of level indication, such as a fuel level gauge.

What is claimed is:

1. A flexible sensor board assembly, comprising:
   a plurality of magnetically sensitive sensor elements;
   a plurality of resistor elements;
   a flexible circuit board on which said sensor elements and said resistor elements are mounted and interconnected; and
   a seal covering said flexible circuit board, sensor elements, and resistor elements,
   wherein said sensor elements and said resistor elements are located on said flexible circuit board to enable bending of said flexible circuit board, said bending having a radius that is a function of the material properties of said flexible circuit board, and the separation distance between adjacent sensor and resistor elements.

2. The flexible sensor board assembly of claim 1, wherein a fitting is coupled to said flexible sensor board assembly for attachment to a sending unit stem.

3. The flexible sensor board assembly of claim 1, wherein one or more wires are coupled to said flexible circuit board to facilitate electrical connection to the assembly.

4. The flexible sensor board assembly of claim 1, wherein said sensor elements comprise at least one of a reed switch and a hall effect switch.

5. The flexible sensor board assembly of claim 1, wherein said seal is formed of heat sensitive dielectric material.

6. The flexible sensor board assembly of claim 1, wherein said resistor elements are selected to calibrate for the geometric variations of a liquid container.

7. A liquid level sending unit, comprising:
   a liquid impervious elongate stem having proximal and distal ends, said elongate stem forming an aperture at said proximal end and sealed at said distal end;
   a flange coupled to said proximal end of said elongate stem;
   a stop ring coupled to said distal end of said elongate stem;
   a float slideably coupled to said elongate stem for sliding up and down and rotating about said stem between said flange and said stop ring, said float having one or more embedded magnets for magnetic communication with a flexible sensor board assembly, said assembly comprising:
   a plurality of magnetically sensitive sensor elements;
   a plurality of resistor elements;
   a flexible circuit board on which said sensor elements and said resistor elements are mounted and interconnected;
   a seal covering said flexible circuit board, sensor elements, and resistor elements; and
   a fitting for removably attaching to said elongate stem, wherein said sensor elements and said resistor elements are located on said flexible circuit board to enable bending of said flexible circuit board, said bending having a radius that is a function of the material properties of said flexible circuit board, and the separation distance between adjacent sensor and resistor elements.

8. The liquid level sending unit of claim 7, wherein one or more wires are coupled to said flexible circuit board to facilitate electrical connection to the assembly.

9. The liquid level sending unit of claim 7, wherein said sensor elements comprise at least one of a reed switch and hall effect sensor.

10. The liquid level sending unit of claim 7, wherein said resistor elements are selected to calibrate for the geometric variations a liquid container.

11. A method of installing a flexible sensor board assembly, the method comprising:
    inserting a portion of said flexible sensor board assembly into a sending unit stem;
    bending said flexible sensor board assembly at least one time during installation;
    inserting a remainder of said flexible sensor board assembly; and
    closing said flexible sensor board assembly onto said sending unit stem.

12. The method of installing a flexible sensor board assembly of claim 11, wherein said bending is at a radius of less than 5 feet.

13. The method of installing a flexible sensor board assembly of claim 11, wherein said bending is at a radius of less than 2 feet.

14. The method of installing a flexible sensor board assembly of claim 11, wherein said flexible sensor board assembly has a seal, and further wherein said seal is formed by dipping the flexible sensor board assembly into a liquid rubber type compound and then set aside to harden, contributing thereby to the overall robustness and durability of the flexible sensor board assembly.

15. The method of installing a flexible sensor board assembly of claim 11, wherein the flexible sensor board assembly is bent to fit within a narrow space between a fuel storage tank and a deck, thereby saving considerable effort and expense because the tank need not be removed or the deck need not be violated to complete the installation.

* * * * *